(12) United States Patent
Pandey et al.

(10) Patent No.: US 11,749,727 B2
(45) Date of Patent: Sep. 5, 2023

(54) BIPOLAR JUNCTION TRANSISTORS WITH DUPLICATED TERMINALS

(71) Applicant: GlobalFoundries U.S. Inc., Malta, NY (US)

(72) Inventors: Shesh Mani Pandey, Saratoga Springs, NY (US); Hong Yu, Clifton Park, NY (US); Alexander Derrickson, Saratoga Springs, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 37 days.

(21) Appl. No.: 17/546,200

(22) Filed: Dec. 9, 2021

(65) Prior Publication Data

US 2023/0096328 A1 Mar. 30, 2023

Related U.S. Application Data (60) Provisional application No. 63/247,396, filed on Sep. 23, 2021.

(51) Int. Cl.
*H01L 29/417* (2006.01)
*H01L 29/10* (2006.01)
*H01L 29/165* (2006.01)
*H01L 29/40* (2006.01)
(Continued)

(52) U.S. Cl.
CPC .... *H01L 29/41708* (2013.01); *H01L 29/1004* (2013.01); *H01L 29/165* (2013.01); *H01L 29/401* (2013.01); *H01L 29/66242* (2013.01); *H01L 29/7371* (2013.01)

(58) Field of Classification Search
CPC .......... H01L 29/41708; H01L 29/1004; H01L 29/165; H01L 29/401; H01L 29/66242; H01L 29/7371
See application file for complete search history.

(56) References Cited

U.S. PATENT DOCUMENTS

| | | |
|---|---|---|
| 5,084,750 A | 1/1992 | Adlerstein |
| 6,235,601 B1 | 5/2001 | Kim |
| 8,809,957 B2 | 8/2014 | Bangsaruntip et al. |

(Continued)

FOREIGN PATENT DOCUMENTS

EP 0812470 B1 3/2003

OTHER PUBLICATIONS

Rucker, H. et al.; "SiGe HBT Technology," IHP Germany, pp. 11-54; https://www.riverpublishers.com/pdf/ebook/chapter/RP_9788793519602C1.pdf (2018).

(Continued)

*Primary Examiner* — Syed I Gheyas
(74) *Attorney, Agent, or Firm* — Thompson Hine LLP; Francois Pagette (57) ABSTRACT

Structures for a bipolar junction transistor and methods of fabricating a structure for a bipolar junction transistor. The structure includes a first base layer, a second base layer, a first terminal positioned between the first base layer and the second base layer, a second terminal, and a third terminal. The first base layer, the second base layer, and the first terminal are positioned between the second terminal and the third terminal. For example, the first terminal may be positioned in a vertical direction between the first and second base layers.

20 Claims, 6 Drawing Sheets

(51) Int. Cl.
*H01L 29/66* (2006.01)
*H01L 29/737* (2006.01)

(56) References Cited

U.S. PATENT DOCUMENTS

| | | |
|---|---|---|
| 9,647,553 B2 | 5/2017 | Alexander et al. |
| 9,842,914 B1 | 12/2017 | Yeung et al. |
| 2016/0064484 A1 | 3/2016 | Harame et al. |
| 2018/0061853 A1* | 3/2018 | Valdes Garcia ...... H03F 3/3066 |

OTHER PUBLICATIONS

European Patent Office, Extended European Search Report issued in European patent application serial No. 22197391.0 dated Feb. 15, 2023, pp. 1-8.

* cited by examiner

BIPOLAR JUNCTION TRANSISTORS WITH DUPLICATED TERMINALS

CROSS-REFERENCE TO RELATED APPLICATIONS

This application claims the benefit of U.S. Provisional Application No. 63/247,396, filed Sep. 23, 2021, which is hereby incorporated by reference herein in its entirety.

BACKGROUND

The disclosure relates generally to semiconductor devices and integrated circuit fabrication and, in particular, to structures for a bipolar junction transistor and methods of forming a structure for a bipolar junction transistor.

A bipolar junction transistor is a multi-terminal electronic device that includes an emitter, a collector, and an intrinsic base arranged between the emitter and collector. In an NPN bipolar junction transistor, the emitter and collector are comprised of n-type semiconductor material, and the intrinsic base is comprised of p-type semiconductor material. In a PNP bipolar junction transistor, the emitter and collector are comprised of p-type semiconductor material, and the intrinsic base is comprised of n-type semiconductor material. During operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials of the terminals have different energy bandgaps, which creates heterojunctions. For example, the collector and/or emitter of a heterojunction bipolar transistor may be constituted by silicon, and the intrinsic base of a heterojunction bipolar transistor may be constituted by a silicon-germanium alloy, which is characterized by a narrower band gap than silicon.

Improved structures for a bipolar junction transistor and methods of forming a structure for a bipolar junction transistor are needed.

SUMMARY

In an embodiment, a structure for a bipolar junction transistor is provided. The structure includes a first base layer, a second base layer, a first terminal positioned between the first base layer and the second base layer, a second terminal, and a third terminal. The first base layer, the second base layer, and the first terminal are positioned between the second terminal and the third terminal.

In an embodiment, a method of fabricating a structure for a bipolar junction transistor is provided. The method includes forming a first base layer, a second base layer, and a first terminal positioned between the first base layer and the second base layer, and forming a second terminal and a third terminal. The first base layer, the second base layer, and the first terminal are positioned in a vertical direction between the second terminal and the third terminal.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
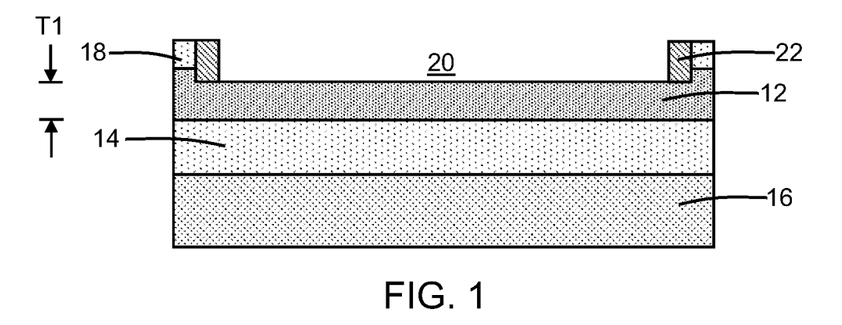
FIGS. 1-8 are cross-sectional views of a structure at successive fabrication stages of a fabrication method in accordance with embodiments of the invention.

With reference to FIG. 1 and in accordance with embodiments of the invention, a semiconductor-on-insulator substrate includes a device layer 12 defining a layer that contains a semiconductor material, a buried insulator layer 14, and a handle substrate 16. The device layer 12 is separated from the handle substrate 16 by the intervening buried insulator layer 14 and may also be considerably thinner than the handle substrate 16. In an embodiment, the device layer 12 may contain an n-type dopant (e.g., phosphorus or arsenic) that provides n-type conductivity. In an alternative embodiment, the device layer 12 may contain a p-type dopant (e.g., boron) that provides p-type conductivity. In an embodiment, the device layer 12 may have a thickness in a range of about 4 nanometers (nm) to about 200 nm. In an embodiment, the device layer 12 may be used to fabricate fully-depleted silicon-on-insulator device structures.

The handle substrate 16 may be comprised of a semiconductor material, such as single-crystal silicon, and the buried insulator layer 14 may be comprised of a dielectric material, such as silicon dioxide, that is an electrical insulator. The device layer 12 is electrically isolated from the handle substrate 16 by the buried insulator layer 14. The buried insulator layer 14 has a lower interface with the handle substrate 16 and an upper interface with the device layer 12, and the lower and upper interfaces are separated by the thickness of the buried insulator layer 14.

A hardmask 18, which may be comprised of a dielectric material such as silicon nitride, is formed. The hardmask 18 is patterned by lithography and etching processes to define an opening in the hardmask 18. An etching process, such as a reactive ion etching process, may then be used to define a recess 20 in the device layer 12 at the location of the opening in the hardmask 18. The recess 20 extends partially through the device layer 12 such that, at the location of the recess 20, the device layer 12 may have a thickness T1.

A dielectric spacer 22 is formed that surrounds the rim of the recess 20 in the device layer 12. The dielectric spacer 22 may be comprised of a dielectric material, such as silicon nitride, that is an electrical insulator. The dielectric spacer 22 may be formed by conformally depositing a layer of the dielectric material and performing an anisotropic etching process.

Figure 2:
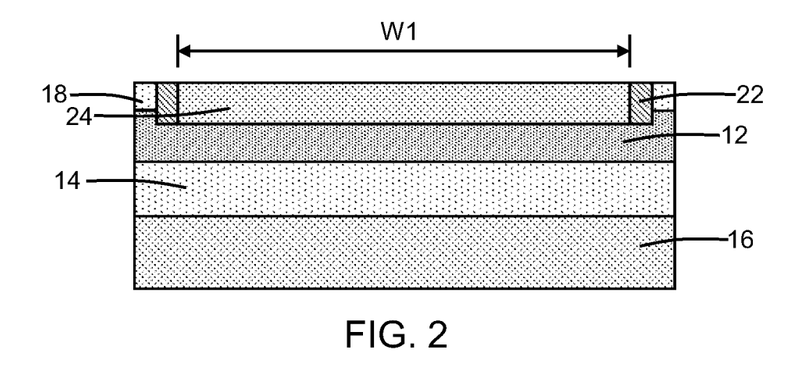

With reference to FIG. 2 in which like reference numerals refer to like features in FIG. 1 and at a subsequent fabrication stage, a semiconductor layer 24 is formed inside the recess 20 in the device layer 12. In an embodiment, the semiconductor layer 24 may be formed by an epitaxial growth process. In an embodiment, the semiconductor layer 24 may be formed by a selective epitaxial growth process. In an embodiment, the semiconductor layer 24 may be in situ doped during epitaxial growth with a p-type dopant (e.g., boron) that provides p-type conductivity. In an alternative embodiment, the semiconductor layer 24 may be in situ doped during epitaxial growth with an n-type dopant (e.g., phosphorus or arsenic) that provides n-type conductivity.

The semiconductor layer 24 fully overlaps with a portion of the device layer 12. More specifically, the semiconductor layer 24 adjoins the overlapped portion of the device layer 12 over a junction (e.g., a collector-base junction), and the junction has an area with a width W1 in a horizontal direction transverse to the vertical direction.

The semiconductor layer 24 may be comprised of a semiconductor material, such as silicon-germanium. In an embodiment, the semiconductor layer 24 may be comprised of silicon-germanium with a germanium content of twenty-five percent (25%) to seventy-five percent (75%). In an embodiment, the germanium content of the semiconductor layer 24 may be graded over its layer thicknesses. In an alternative embodiment, the semiconductor layer 24 may be comprised of silicon.

Figure 3:
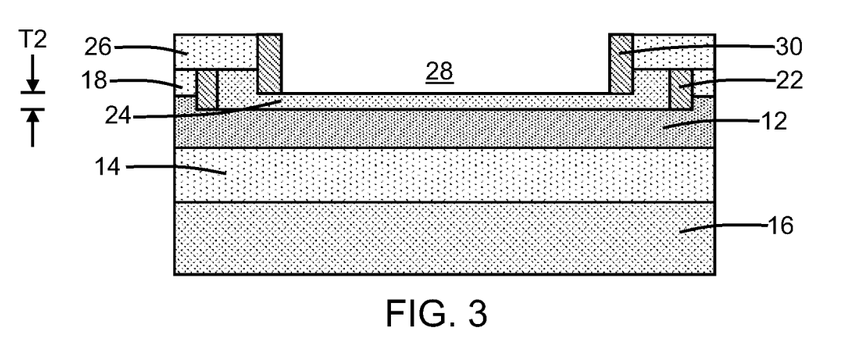

With reference to FIG. 3 in which like reference numerals refer to like features in FIG. 2 and at a subsequent fabrication stage, a hardmask 26, which may be comprised of a dielectric material such as silicon nitride, is formed. The hardmask 26 may be patterned by lithography and etching processes to define an opening in the hardmask 26. An etching process, such as a reactive ion etching process, may then be used to define a recess 28 in the semiconductor layer 24 at the location of the opening in the hardmask 26. The recess 28 extends partially through the semiconductor layer 24 and, at the location of the recess 28, the thinned semiconductor layer 24 may have a thickness T2.

A dielectric spacer 30 is formed that surrounds the rim of the recess 28 in the semiconductor layer 24. The dielectric spacer 30 may be comprised of a dielectric material, such as silicon nitride, that is an electrical insulator. The dielectric spacer 30 may be formed by conformally depositing a layer of the dielectric material and performing an anisotropic etching process.

Figure 4:
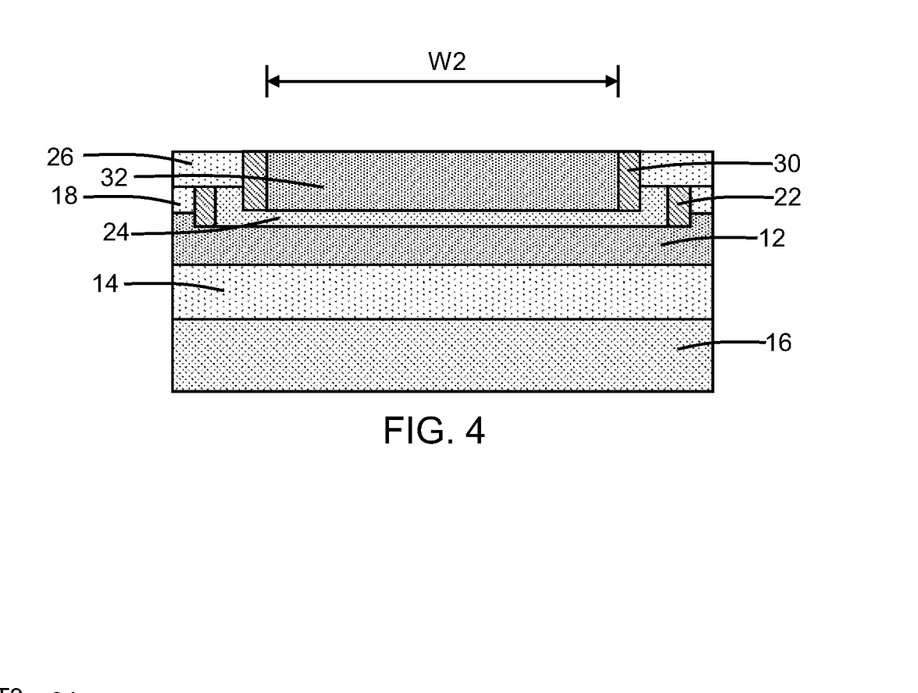

With reference to FIG. 4 in which like reference numerals refer to like features in FIG. 3 and at a subsequent fabrication stage, a semiconductor layer 32 is formed inside the recess 28 in the semiconductor layer 24. In an embodiment, the semiconductor layer 32 may be formed by an epitaxial growth process. In an embodiment, the semiconductor layer 32 may be formed by a selective epitaxial growth process. In an embodiment, the semiconductor layer 32 may be in situ doped during epitaxial growth with an n-type dopant (e.g., phosphorus or arsenic) that provides n-type conductivity. In an alternative embodiment, the semiconductor layer 32 may be in situ doped during epitaxial growth with a p-type dopant (e.g., boron) that provides p-type conductivity. In an embodiment, the semiconductor layer 32 may be comprised of a semiconductor material, such as silicon.

The semiconductor layer 32 fully overlaps with a portion of the semiconductor layer 24. The semiconductor layer 32 adjoins the overlapped portion of the semiconductor layer 24 over a junction (e.g., an emitter-base junction), and the junction has an area with a width W2 in a horizontal direction transverse to the vertical direction. The width and area of the junction between the semiconductor layers 24, 32 are less than the width and area of the junction between the semiconductor layer 24 and the device layer 12.

Figure 5:
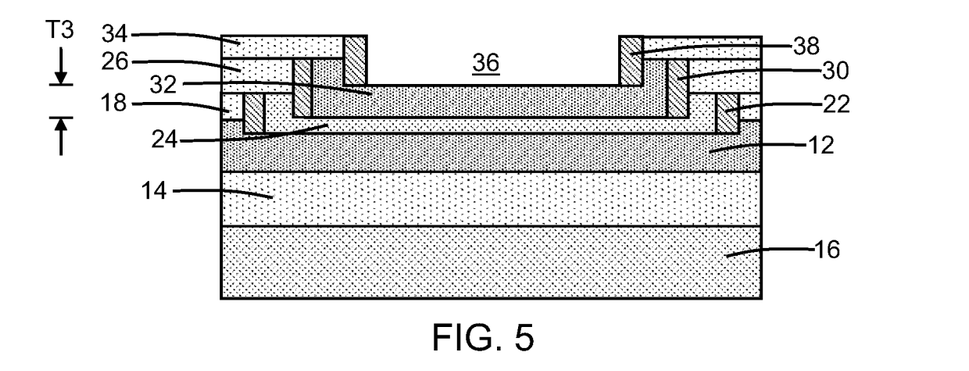

With reference to FIG. 5 in which like reference numerals refer to like features in FIG. 4 and at a subsequent fabrication stage, a hardmask 34, which may be comprised of a dielectric material such as silicon nitride, is formed. The hardmask 34 may be patterned by lithography and etching processes to define an opening in the hardmask 34. An etching process, such as a reactive ion etching process, may then be used to define a recess 36 in the semiconductor layer 32 at the location of the opening in the hardmask 34. The recess 36 extends partially through the semiconductor layer 32 and, at the location of the recess 36, the thinned semiconductor layer 32 may have a thickness T3.

A dielectric spacer 38 is formed that surrounds the rim of the recess 36 in the semiconductor layer 32. The dielectric spacer 38 may be comprised of a dielectric material, such as silicon nitride, that is an electrical insulator. The dielectric spacer 38 may be formed by conformally depositing a layer of the dielectric material and performing an anisotropic etching process.

Figure 6:
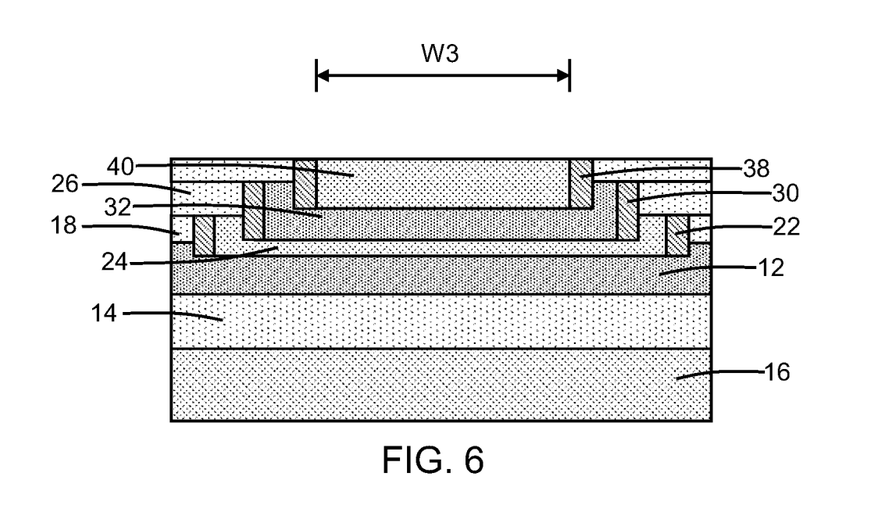

With reference to FIG. 6 in which like reference numerals refer to like features in FIG. 5 and at a subsequent fabrication stage, a semiconductor layer 40 is formed inside the recess 36 in the semiconductor layer 32. In an embodiment, the semiconductor layer 40 may be formed by an epitaxial growth process. In an embodiment, the semiconductor layer 40 may be formed by a selective epitaxial growth process. In an embodiment, the semiconductor layer 40 may be in situ doped during epitaxial growth with a p-type dopant (e.g., boron) that provides p-type conductivity. In an alternative embodiment, the semiconductor layer 40 may be in situ doped during epitaxial growth with an n-type dopant (e.g., phosphorus or arsenic) that provides n-type conductivity.

The semiconductor layer 40 fully overlaps with a portion of the semiconductor layer 32. The semiconductor layer 40 adjoins the overlapped portion of the semiconductor layer 32 over a junction (e.g., an emitter-base junction), and the junction has an area with a width W3 in a horizontal direction transverse to the vertical direction. The width and area of the junction between the semiconductor layers 32, 40 are less than the width and area of the junction between the semiconductor layers 24, 32. The junctions in which the semiconductor layer 32 participates are asymmetrical with the lower junction between the semiconductor layers 24, 32 being characterized by a larger width and area than the upper junction between the semiconductor layers 32, 40.

The semiconductor layer 40 may be comprised of a semiconductor material, such as silicon-germanium. In an embodiment, the semiconductor layer 40 may be comprised of silicon-germanium with a germanium content of twenty-five percent (25%) to seventy-five percent (75%). In an embodiment, the germanium content of the semiconductor layer 40 may be graded over its layer thicknesses. In an alternative embodiment, the semiconductor layer 40 may be comprised of silicon.

Figure 7:
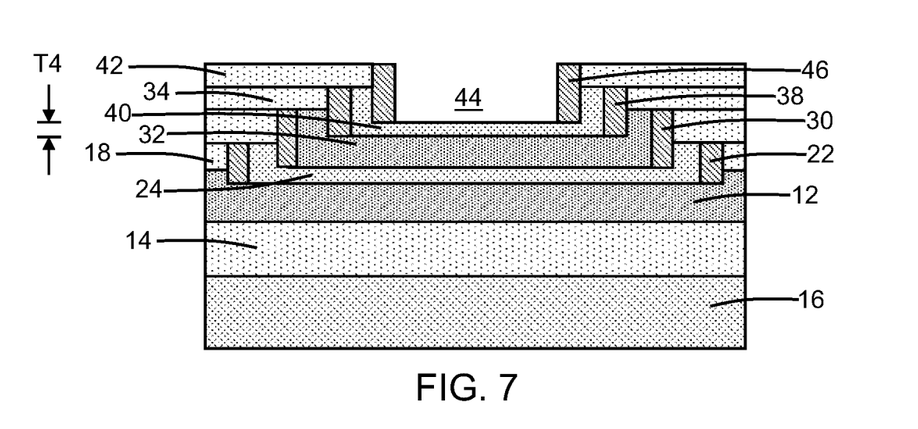

With reference to FIG. 7 in which like reference numerals refer to like features in FIG. 6 and at a subsequent fabrication stage, a hardmask 42, which may be comprised of a dielectric material such as silicon nitride, is formed. The hardmask 42 may be patterned by lithography and etching processes to define an opening in the hardmask 42. An etching process, such as a reactive ion etching process, may then be used to define a recess 44 in the semiconductor layer 40 at the location of the opening in the hardmask 42. The recess 44 extends partially through the semiconductor layer 40 and, at the location of the recess 44, the thinned semiconductor layer 40 may have a thickness T4.

In an embodiment, the thinned semiconductor layer 24 and the thinned semiconductor layer 40 may have equal or substantially equal thicknesses. In an alternative embodiment, the thinned semiconductor layer 24 and the thinned semiconductor layer 40 may have different thicknesses. In an embodiment, the thicknesses of the thinned semiconductor layer 24 and the thinned semiconductor layer 40, each participating in respective junctions with the semiconductor layer 32, may be less than or equal to about 20 nm. In an embodiment, the thicknesses of the thinned semiconductor layer 24 and the thinned semiconductor layer 40 may be range from about 5 nm to about 20 nm.

A dielectric spacer 46 is formed that surrounds the rim of the recess 44 in the semiconductor layer 40. The dielectric spacer 46 may be comprised of a dielectric material, such as silicon nitride, that is an electrical insulator. The dielectric spacer 46 may be formed by conformally depositing a layer of the dielectric material and performing an anisotropic etching process.

Figure 8:
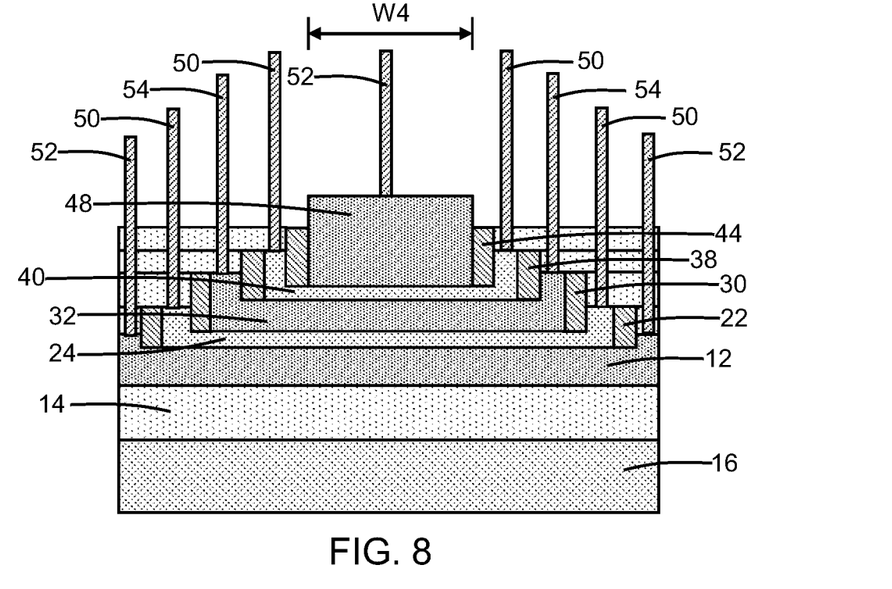

With reference to FIG. 8 in which like reference numerals refer to like features in FIG. 7 and at a subsequent fabrication stage, a semiconductor layer 48 is formed inside the recess 44 in the semiconductor layer 40. In an embodiment, the semiconductor layer 48 may be formed by an epitaxial growth process. In an embodiment, the semiconductor layer 48 may be formed by a selective epitaxial growth process. In an embodiment, the semiconductor layer 48 may be in situ doped during epitaxial growth with an n-type dopant (e.g., phosphorus or arsenic) that provides n-type conductivity. In an alternative embodiment, the semiconductor layer 48 may be in situ doped during epitaxial growth with a p-type dopant (e.g., boron) that provides p-type conductivity. The semiconductor layer 48 may be comprised of a semiconductor material, such as silicon.

The semiconductor layer 48 fully overlaps with a portion of the semiconductor layer 40. The semiconductor layer 48 adjoins the overlapped portion of the semiconductor layer 40 over a junction (e.g., a collector-base junction), and the junction has an area with a width W4 in a horizontal direction transverse to the vertical direction. The width and area of the junction between the semiconductor layers 40, 48 are less than the width and area of the junction between the semiconductor layers 32, 40.

The tiered arrangement has a vertical architecture in which the semiconductor layer 24 and the semiconductor layer 40 represent terminals (i.e., multiple intrinsic bases) of a bipolar junction transistor, the device layer 12 and the semiconductor layer 48 represent terminals (i.e., multiple collectors) of the bipolar junction transistor, and the semiconductor layer 32 represents a terminal (i.e., an emitter) of the bipolar junction transistor. The semiconductor layer 24 is positioned in a vertical direction between the device layer 12 and the semiconductor layer 32. Non-overlapped portions of the semiconductor layer 24 are available in the tiered arrangement for landing contacts. The semiconductor layer 32 is positioned in a vertical direction between the semiconductor layer 24 and the semiconductor layer 40. Non-overlapped portions of the semiconductor layer 32 are available in the tiered arrangement for landing contacts. The semiconductor layer 40 is positioned in a vertical direction between the semiconductor layer 32 and the semiconductor layer 48. Non-overlapped portions of the semiconductor layer 40 are available in the tiered arrangement for landing contacts.

Base contacts 50 are formed that are physically and electrically connected to the semiconductor layers 24, 40, collector contacts 52 are formed that are physically and electrically connected to the device layer 12 and the semiconductor layer 48, and emitter contacts 54 are formed that are physically and electrically connected to the semiconductor layer 32. The contacts 50, 52, 54 are formed in a dielectric layer that is deposited, planarized, and patterned with lithography and etching processes to define contact openings. The contacts 50, 52, 54 may be formed by depositing a layer comprised of a metal, such as tungsten, that fills the contact openings and then planarizing the deposited layer with, for example, chemical-mechanical polishing.

The resultant bipolar junction transistor may include multiple intrinsic bases, multiple collectors, and an emitter that have a vertical arrangement. The vertical bipolar junction transistor has a narrow base width that may boost the high-frequency performance of the bipolar junction transistor and, in particular, the narrow base width may be effective to boost the performance parameters Ft and Fmax. The vertical bipolar junction transistor may be capable of handling high current currents during operation because of the inclusion of multiple intrinsic bases and multiple collectors.

In an embodiment, the vertical bipolar junction transistor may be wired to construct a cascode circuit in which an input common-emitter configuration drives an output common-base configuration.

Figure 9:
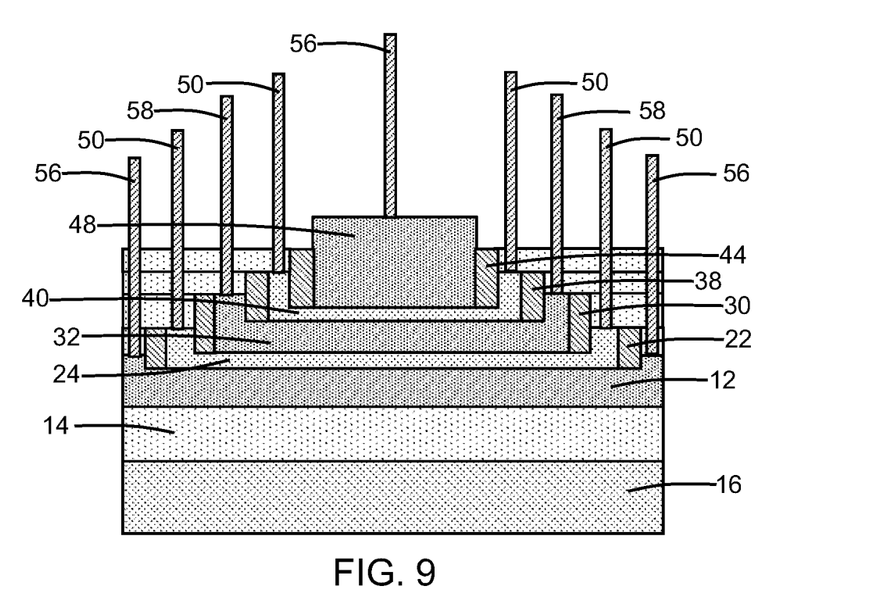
FIG. 9 is a cross-sectional view of a structure in accordance with alternative embodiments of the invention.

With reference to FIG. 9 and in accordance with alternative embodiments, the contacts may be modified to provide the vertical bipolar junction transistor with multiple emitters instead of multiple collectors. Specifically, emitter contacts 56 are formed that are physically and electrically connected to the device layer 12 and the semiconductor layer 48, and collector contacts 58 are formed that is physically and electrically connected to the semiconductor layer 32. The width and area of the junction between the semiconductor layers 32, 40 are less than the width and area of the junction between the semiconductor layers 24, 32. The junctions (e.g., collector-base junctions) are asymmetrical with the lower junction between the semiconductor layers 24, 32 being characterized by a larger width and area than the upper junction between the semiconductor layers 32, 40.

Figure 10:
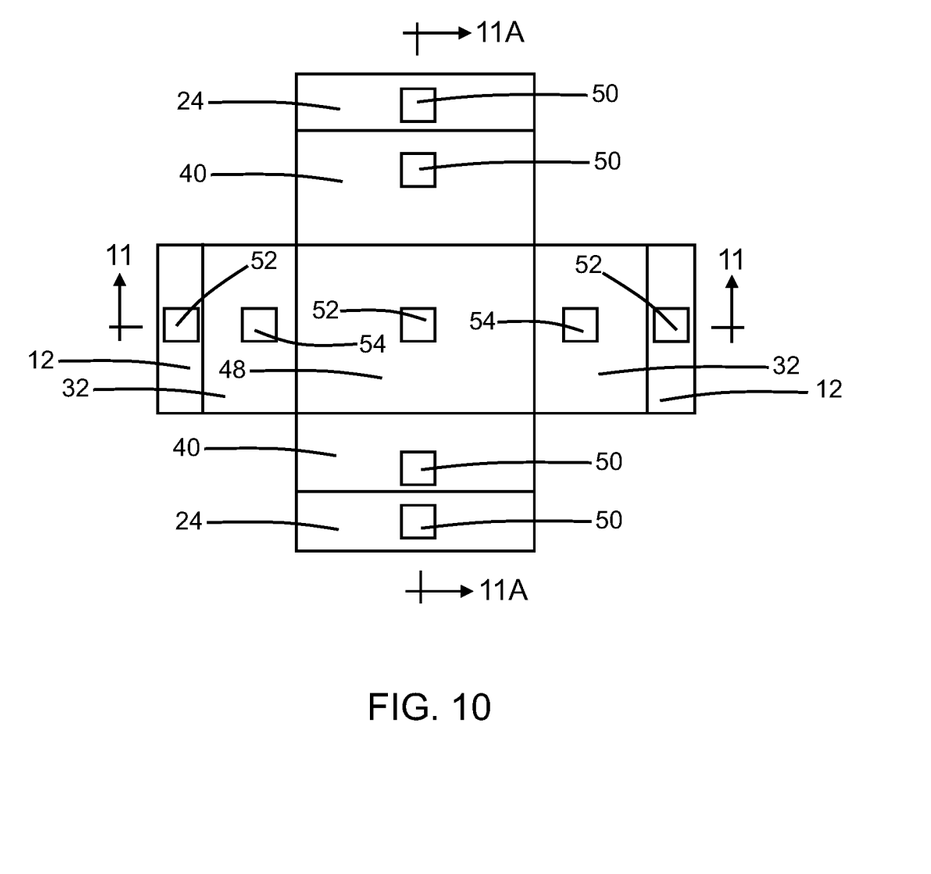
FIG. 10 is a diagrammatic top view, simplified for purposes of illustration, of a structure in accordance with alternative embodiments of the invention.
Figure 11:
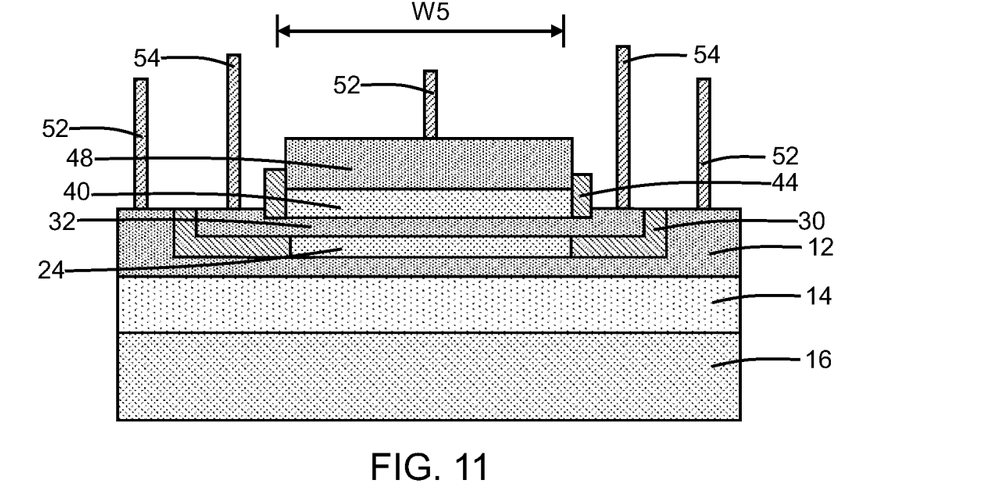
FIG. 11 is a cross-sectional view taken generally along line 11-11 in FIG. 10.
Figure 11A:
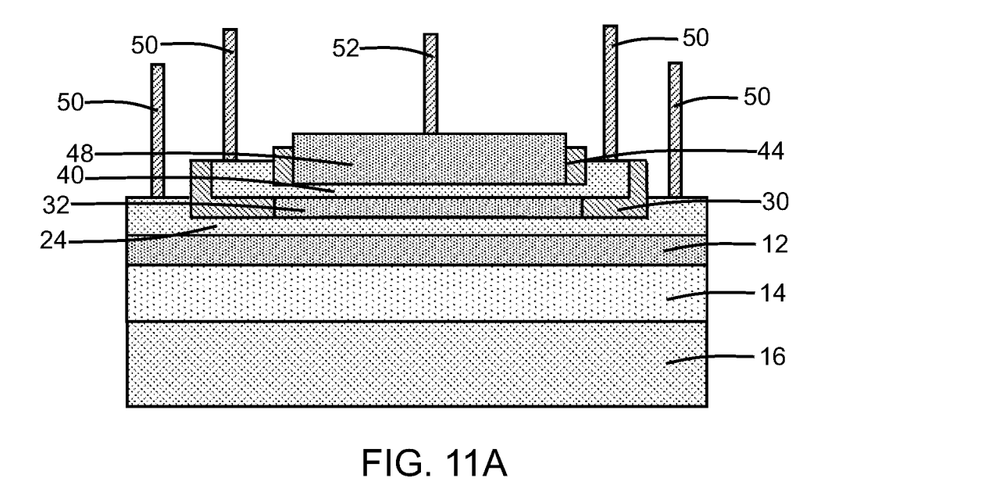
FIG. 11A is a cross-sectional view taken generally along line 11A-11A in FIG. 10.

With reference to FIGS. 10, 11, 11A and in accordance with alternative embodiments, the vertical bipolar junction transistor may be arranged with a different layout in which the sizes of the semiconductor layers 24, 40 providing the intrinsic bases are equal or substantially equal. The semiconductor layer 32 adjoins the underlying semiconductor layer 24 and the overlying semiconductor layer 40 over equal or substantially equal areas to define lower and upper junctions (e.g., emitter-base junctions). As a result, the emitter-base junctions of the vertical bipolar junction transistor are symmetrical with the lower junction and the upper junction having equal or substantially equal widths W5 and areas. The dielectric spacers 30 are formed with horizontal extensions to adjust the horizontal dimensions of the semiconductor layer 32 such that the area and width of the emitter-base junctions are equal. The semiconductor layers 24, 40 extend laterally from the opposite side edges of the vertical bipolar junction transistor to define extrinsic bases that permit landing of the base contacts 50.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a bipolar junction transistor, the structure comprising:
    a first base layer;
    a second base layer;
    a first terminal positioned in a vertical direction between the first base layer and the second base layer;
    a second terminal; and
    a third terminal,
    wherein the first base layer, the second base layer, and the first terminal are positioned between the second terminal and the third terminal.

2. The structure of claim 1 wherein the first terminal is an emitter, the second terminal is a first collector, and the third terminal is a second collector.

3. The structure of claim 1 wherein the first terminal is a collector, the second terminal is a first emitter, and the third terminal is a second emitter.

4. The structure of claim 1 wherein the first base layer and the second base layer each comprise silicon-germanium.

5. The structure of claim 1 wherein the first terminal fully overlaps with a portion of the first base layer, and the second base layer fully overlaps with a portion of the first terminal.

6. The structure of claim 5 wherein the first base layer is positioned in the vertical direction between the first terminal and the second terminal, and the second base layer is positioned in the vertical direction between the first terminal and the third terminal.

7. The structure of claim 6 further comprising:
    a handle substrate; and
    a dielectric layer on the handle substrate,
    wherein the second terminal is positioned in the vertical direction between the dielectric layer and the first base layer.

8. The structure of claim 5 wherein the first terminal adjoins the portion of the first base layer over a first junction having a first width in a horizontal direction transverse to the vertical direction, the second base layer adjoins the portion of the first terminal over a second junction having a second width in the horizontal direction, and the first width is equal to the second width.

9. The structure of claim 5 wherein the first terminal adjoins the portion of the first base layer over a first junction having a first width in a horizontal direction transverse to the vertical direction, the second base layer adjoins the portion of the first terminal over a second junction having a second width in the horizontal direction, and the first width is greater than the second width.

10. The structure of claim 1 wherein the first base layer has a first thickness, the second base layer has a second thickness, the first base layer comprises silicon-germanium having a germanium content that varies over the first thickness, and the second base layer comprises silicon-germanium having a germanium content that varies over the second thickness.

11. The structure of claim 1 wherein the first base layer has a first thickness, and the second base layer has a second thickness, and the first thickness and the second thickness are each in a range between 5 nanometers and 20 nanometers.

12. The structure of claim 1 wherein the first base layer is positioned between the first terminal and the second terminal, and the second base layer is positioned between the first terminal and the third terminal.

13. The structure of claim 1 wherein the first base layer, the second base layer, and the first terminal are positioned in the vertical direction between the second terminal and the third terminal.

14. A structure for a bipolar junction transistor, the structure comprising:
    a first base layer;
    a second base layer;
    a first terminal positioned between the first base layer and the second base layer;
    a second terminal; and
    a third terminal,
    wherein the first base layer, the second base layer, and the first terminal are positioned between the second terminal and the third terminal, and the first base layer, the second base layer, and the first terminal are positioned in a vertical direction between the second terminal and the third terminal.

15. A method of fabricating a structure for a bipolar junction transistor, the method comprising:
    forming a first base layer, a second base layer, and a first terminal positioned between the first base layer and the second base layer; and forming a second terminal and a third terminal,
wherein the first base layer, the second base layer, and the first terminal are positioned between the second terminal and the third terminal.

16. The method of claim 15 wherein forming the first base layer, the second base layer, and the first terminal positioned between the first base layer and the second base layer comprises:
   forming a layer stack including a first semiconductor layer, a second semiconductor layer, and a third semiconductor layer;
   patterning the first semiconductor layer to form the first base layer;
   patterning the second semiconductor layer to form the first terminal; and
   patterning the third semiconductor layer to form the second base layer.

17. The method of claim 16 wherein the first base layer and the second base layer each comprise silicon-germanium.

18. The method of claim 15 wherein the first base layer is positioned in a vertical direction between the first terminal and the second terminal, and the second base layer is positioned in the vertical direction between the first terminal and the third terminal.

19. The method of claim 16 whereon the first base layer, the second base layer, and the first terminal are positioned in a vertical direction between the second terminal and the third terminal.

20. The method of claim 16 wherein the first terminal fully overlaps with a portion of the first base layer, and the second base layer fully overlaps with a portion of the first terminal.

* * * * *

UNITED STATES PATENT AND TRADEMARK OFFICE
CERTIFICATE OF CORRECTION

PATENT NO. : 11,749,727 B2
APPLICATION NO. : 17/546200
DATED : September 5, 2023
INVENTOR(S) : Shesh Mani Pandey, Hong Yu and Alexander Derrickson It is certified that error appears in the above-identified patent and that said Letters Patent is hereby corrected as shown below:

In the Claims

Column 9, Claim 19, Line 25 reads:
"19. The method of claim 16 whereon the first base layer,"

It should read:
--19. The method of claim 16 wherein the first base layer,--

Signed and Sealed this
Third Day of October, 2023

Katherine Kelly Vidal
*Director of the United States Patent and Trademark Office*